(12) United States Patent
Javora et al.

(10) Patent No.: US 9,791,474 B2
(45) Date of Patent: Oct. 17, 2017

(54) CURRENT SENSING DEVICE, AND METHOD OF MANUFACTURING THE SAME

(71) Applicant: ABB TECHNOLOGY AG, Zürich (CH)

(72) Inventors: Radek Javora, Brno (CZ); Jaromir Podzemny, Brno (CZ); Petr Velesik, Brno (CZ)

(73) Assignee: ABB Schweiz AG, Baden (CH)

( * ) Notice: Subject to any disclaimer, the term of this patent is extended or adjusted under 35 U.S.C. 154(b) by 318 days.

(21) Appl. No.: 14/323,559

(22) Filed: Jul. 3, 2014

(65) Prior Publication Data

US 2015/0008903 A1 Jan. 8, 2015

(30) Foreign Application Priority Data

Jul. 3, 2013 (EP) .................................... 13003381

(51) Int. Cl.
*G01R 15/18* (2006.01)
*G01R 1/22* (2006.01)

(52) U.S. Cl.
CPC ............. *G01R 1/22* (2013.01); *G01R 15/181* (2013.01); *Y10T 29/49007* (2015.01)

(58) Field of Classification Search
CPC .. G01R 15/181; G01R 15/186; G01R 15/183; G01R 31/04; G01R 1/22; G01N 27/904; H04B 5/0043; H04B 5/0075; H04W 4/008; H04W 84/12
See application file for complete search history.

(56) References Cited

U.S. PATENT DOCUMENTS

| | | | | | |
|---|---|---|---|---|---|
| 3,626,291 | A | * | 12/1971 | Yauch | G01R 15/181 324/117 R |
| 4,794,328 | A | * | 12/1988 | Fernandes | G01K 1/024 29/240 |
| 7,884,598 | B2 | * | 2/2011 | Wang | G01R 1/22 324/117 H |
| 2011/0025305 | A1 | * | 2/2011 | Lint | G01R 15/181 324/150 |
| 2011/0148561 | A1 | | 6/2011 | Lint et al. | |

FOREIGN PATENT DOCUMENTS

WO    WO 2013/093516 A1    6/2013

OTHER PUBLICATIONS

European Search Report, completed on Nov. 18, 2013, by the European Patent Office as the International Searching Authority for European Patent 13003381.4.

* cited by examiner

*Primary Examiner* — Vinh Nguyen
(74) *Attorney, Agent, or Firm* — Taft Stettinius & Hollister LLP

(57) ABSTRACT

A current sensing device and method of manufacturing a sensing device are disclosed. The current sensing device can include at least two current sensors, implemented in an openable ring-shaped support, and wherein the at least two current sensors can be arranged in a chain-like arrangement on the ring-shaped support, and wherein the at least two current sensors are electrically connected in series.

15 Claims, 9 Drawing Sheets

State of the art

State of the art

State of the art

CURRENT SENSING DEVICE, AND METHOD OF MANUFACTURING THE SAME

RELATED APPLICATION

This application claims priority under 35 U.S.C. §119 to European Patent Application No. 13003381.4 filed in Europe on Jul. 3, 2013, the entire content of which is hereby incorporated by reference in its entirety.

FIELD

The present disclosure relates to a current sensing device with at least two current sensors, implemented in an openable ring-shaped support, and a method of making the same.

BACKGROUND INFORMATION

Known current sensor systems used for split-core current sensing devices can use three constructional features.

A known flexible current sensing device as shown in FIG. 7 can include an openable locking mechanism, which can consist of a flexible coil, a male locking part, a female locking part and output cable. This concept can have easy assembly but can have poor accuracy caused by not having an exactly round and stable shape.

A known measurement devices as shown in FIG. 8 can be made from two solid halves, which can be electrically interconnected by some type of connector, to achieve closed internal circuit and output cable. For example, this concept can have good accuracy and easy assembly but can be significantly higher in price and the design can be more complex.

A known measurement devices as shown in FIG. 9 can be made from two solid halves assembled together using a hinge and electrically interconnected by some type of cable placed outside of device body to achieve closed internal circuit, a locking system and an output cable. The concept can have good accuracy and relatively easy assembly on a measured line but can be higher price, the design can be more complex, and the concept can have an increased risk of interconnecting cable damage.

SUMMARY

A current sensing device as disclosed, comprising: an openable ring-shaped support; and at least two current sensors, implemented in the openable ring-shaped support, and wherein the at least two current sensors are arranged in a chain-like arrangement on the ring-shaped support, and wherein the at least two current sensors are electrically connected in series.

BRIEF DESCRIPTION OF THE DRAWINGS

In the following, features will be described in greater detail by reference to exemplary embodiments and with reference to the accompanying drawings, in which.

DETAILED DESCRIPTION

Figure 1:
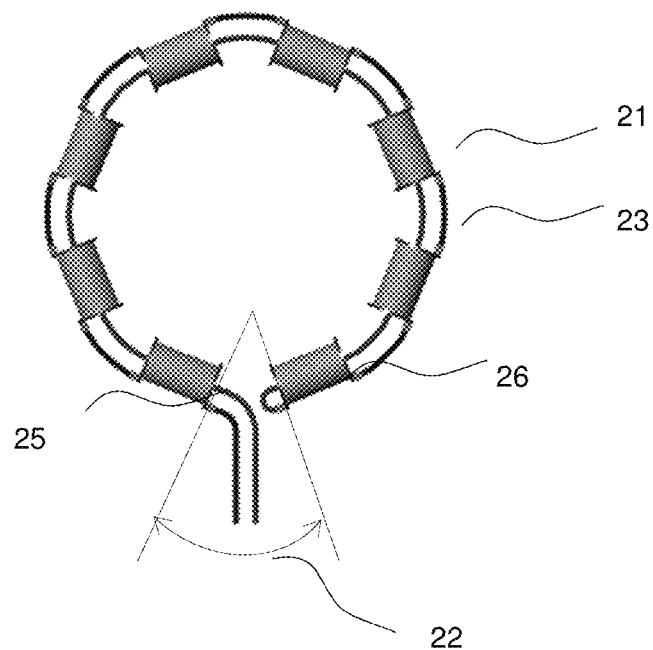
FIG. 1 shows an exemplary current sensing device consisting of the chain of linear coils (upper figure) and an exemplary current sensing device with a housing (lower figure)
Figure 1:
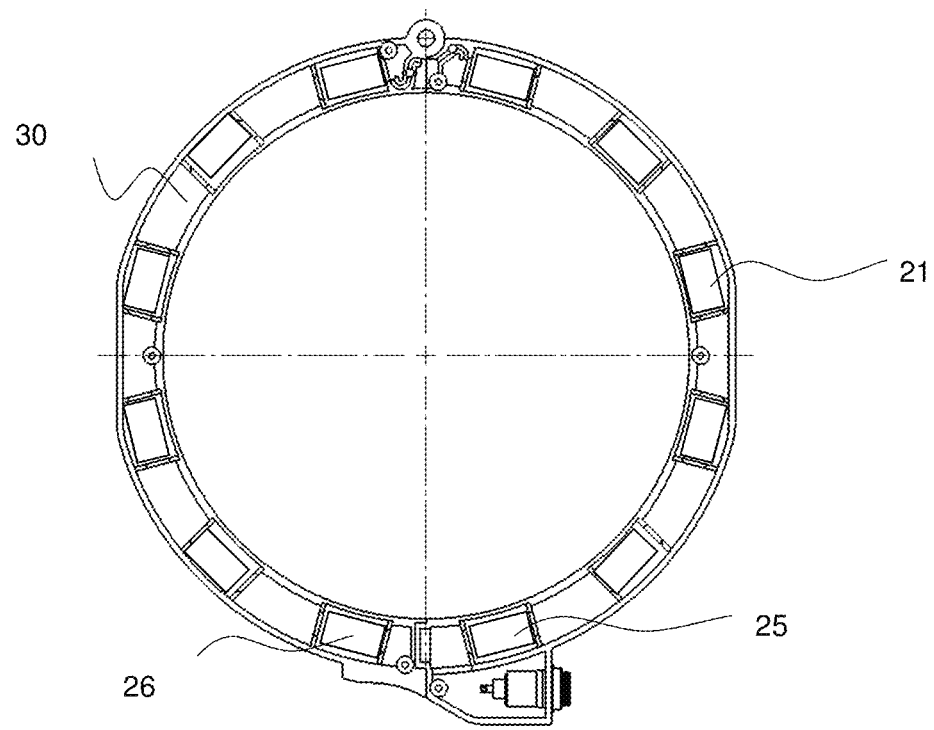

In accordance with an exemplary embodiment, the present disclosure can optimize the structural shape of current sensor devices to enhance ease of manufacturing with a sensor having high accuracy.

In an exemplary embodiment, a current sensing device is disclosed that includes a plurality of current sensors, for example, more than two current sensors, which are arranged in a chain-like arrangement in a ring-shaped support, and wherein the two or more current sensors are electrically connected in series.

In an exemplary embodiment, the current sensors can be at least partly linear coils, which can be connected in series.

In an exemplary embodiment, the ring-shaped support can be divided into two half-ring elements, which can be mechanically connected by a hinge.

In an exemplary embodiment, the chain of the at least partly linear coils can be connected in series, which can enable opening of the device at least between a first and a last linear coil, and which can allow flexibility of the remaining part of the current sensor device in order to open the device without disconnecting the circuit to be measured.

In an exemplary embodiment, the electrical continuous interconnection between a first group of current sensors in a first half-ring element and a second group of current sensors in a second half-ring element can be interconnection wires or cables. The interconnection wires or cables can be dimensioned, for example, in length, such that the current sensing device can release a length (or reservoir length) of the interconnecting wires or cables during the opening of the current sensor device ring via a hinge.

In an exemplary embodiment, the linear coils can be arranged such that they have equal gap between each of them.

In an exemplary embodiment, the ring-shaped support together with the arranged current sensors on the ring-shaped support can be covered by a ring-shaped housing. The ring-shaped housing for the linear coils can be made of at least partly conductive material or can have an at least partly conductive inner or outer surface treatment.

In an exemplary embodiment, the ring-shaped housing can function as the aforesaid support of the current sensor arrangement, and the housing itself can be divided into the aforesaid two half-ring elements, which can be mechanically connected by a hinge.

In accordance with an exemplary embodiment, the return conductor can be wired to go backwards from the last to the first coil through the center of each coil in the chain arrangement of the coils or at least around each coil.

In accordance with an exemplary embodiment, the sensing device can be flexible in shape so it can be at least partly bended in each space between each coil or the sensing device can be made as rigid solution having at least two separable parts with at least one connecting point connecting the internal wires and coils together.

In accordance with an exemplary embodiment, for example, the coils can have a ferromagnetic core or the core material may be any kind of non-magnetic material.

According to a method of manufacture of a current sensor device as disclosed, the sensing device can be based on the use of the Rogowski coil principle, using at least two linear coils connected in series which allows division of the device between the at least two linear coils and can have an openable design by the use of a sealing and wire positioning system, such that it seals a main cavity in each part of the device during potting by a protective and fixation material, which can avoid the leakage of such material around interconnecting wires by using a combination of thin sockets and sealing pins, used during potting by lower viscosity material, and which can also position the interconnecting wires close to the center of the cavity designed for the wire loop protection.

In an exemplary embodiment of the method, for higher viscosity material the sealing pins may not be used and/or the sockets can be shortened.

In an exemplary embodiment, the current sensing device can be designed for minimum prolongation of interconnecting wires during opening of the sensing device by positioning the hinge rotary axis as close as possible to the outer diameter of the sensing device.

In an exemplary embodiment, the current sensing device can include a flat part and rotary pin, which can be part of the hinge.

FIG. 1 shows an exemplary embodiment of a current sensing device having an openable or split-core current sensing device construction, which can be optimized from a shape, a manufacturing, an assembly and an ergonomic point of view. The openable design of a current sensing device as disclosed can be mounted directly on a desired measurement location without disassembling or dismantling of the circuit. Construction of the openable current sensing device can be solid or at least partly flexible, which can achieve the best accuracy of measured values.

In the upper part (or upper figure) of FIG. 1, a chain of small coils 21 can be connected in series with an equal gap or distance 22 in between each of the coils 21.

In order to improve accuracy, it can be desirable to have symmetry between each linear coil 21, for example, the same gap or distance 22 between each linear coil 21.

In order to reduce the effect of stray magnetic fields, a return conductor 23 going from the last coil 26 back to the first one 25 through the center of each coil in the chain can be used. In accordance with an exemplary embodiment, in order to make the current sensing device openable, the opening between the first linear coil 25 and the last linear coil 26 in the chain of these coils 21, can be designed such that there does not need to be any wires directly between them.

The lower part (or lower figure) of FIG. 1 shows the construction of the housing, which can follow the basic mechanical distribution or location of the several coils like shown in the upper part of FIG. 1.

In accordance with an exemplary embodiment, as it would be more complex to shield each individual coil and wires from external disturbances, a housing 30, like shown in the lower part of FIG. 1, can be used to shield each of the coils. The housing 30 can be made at least partly of a conductive material, can have a conductive surface treatment, or can have additional shielding material around the housing 30.

Figure 2:
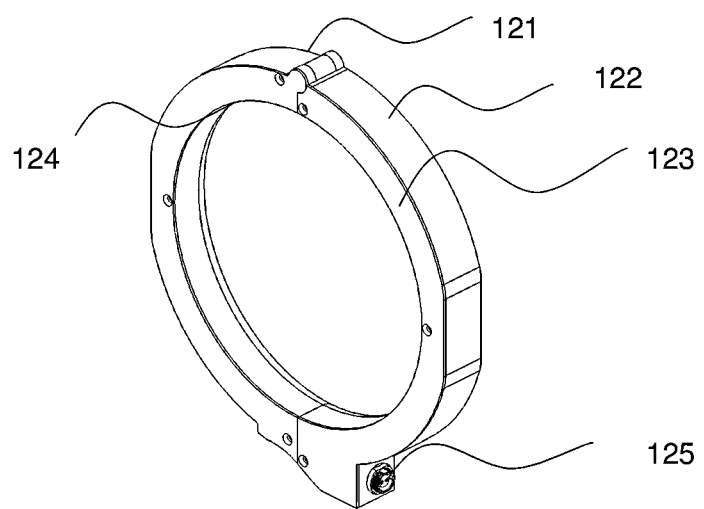
FIG. 2 shows a perspective view of an exemplary current sensing device.

FIG. 2 shows an exemplary sensor housing as shown in FIG. 1 in a perspective view. As shown in FIG. 2, the openable current sensing device can be constructed to optimize the shape, ease of manufacturing and assembly, and an ergonomic point of view. In accordance with an exemplary embodiment, the openable design of the current sensing device can allow for the mounting of the current sensing device directly on a desired measurement place without dismantling of the circuit. Construction of this openable current sensing device can achieve high accuracy of measured values.

In accordance with an exemplary embodiment, construction of a device frame should be from thermoplastic, thermoset or metal material with electrical shielding treatment or the materials shielding properties. For example, measuring elements based on a Rogowski coil can include various number of small linear coils and a dividing plane between two of the linear coils. The two halves of the openable current sensing device can use a hinge for mechanical and wires for electrical interconnection and can also provide protection to interconnecting wires hidden inside. In accordance with an exemplary embodiment, the number of used parts can be lowered by grouping of functions and overall design can be made with respect to easy production and assembly process. In accordance with an exemplary embodiment, a locking system and the hinge can be integral parts of the both halves of the device. For example, in accordance with an exemplary embodiment, fixed or detachable cables can be used in this design.

Figure 3:
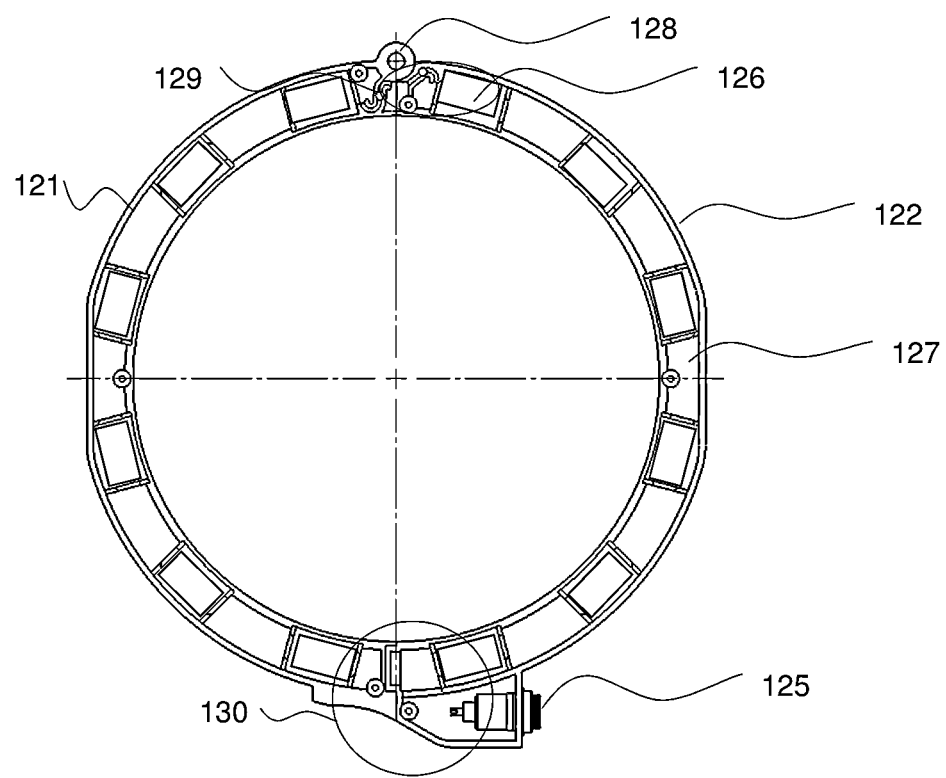
FIG. 3 shows a housing of an exemplary current sensing device (upper figure) and details of an exemplary hinge of the current sensing device (lower figure)
Figure 3:
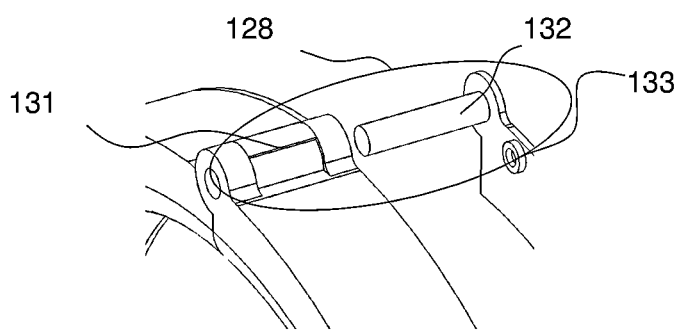

In accordance with an exemplary embodiment, the openable current sensing device can include two basic parts 121, 122, which can be made as a shell from thermoplastic, thermoset or metal material with electrical shielding treatment or material own shielding properties, two cover parts 123, 124, as shown in FIG. 3, from the same material or material with similar shielding properties, which combines a function of electrical field shield, mechanical protection and the hinge 128 and pin 132 as shown in FIG. 3, as well as the output connector or fixed cable 125, current sensing element 126 based on Rogowski coil principle and potting material 127 filled into both basic parts 121, 122 of the sensing device for the sensing element 126 fixation and mechanical protection.

Figure 4:
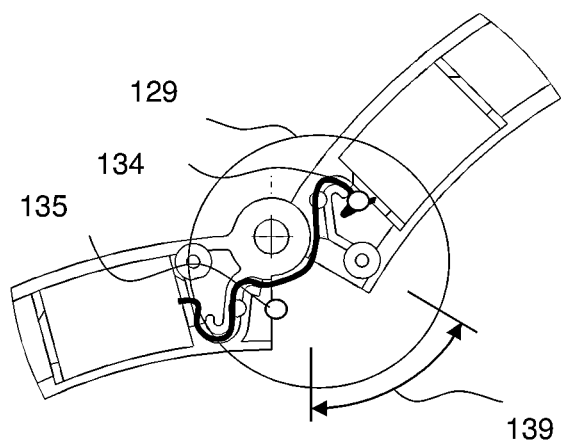
FIG. 4 shows an exemplary hinge with a cable arrangement for an exemplary current sensing device.
Figure 5:
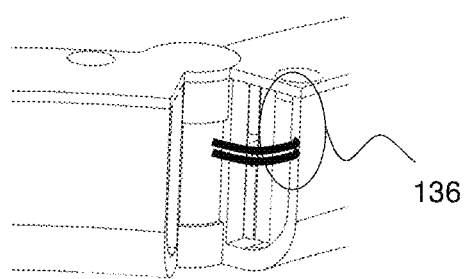
FIG. 5 shows a detailed view into the hinge from perspective view of an exemplary current sensing device.
Figure 6:
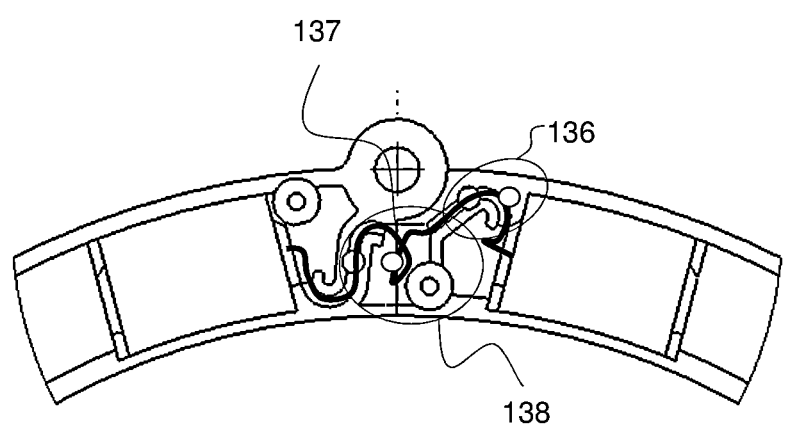
FIG. 6 shows a detail of an exemplary hinge and the cable arrangement for an exemplary current sensing device.

In accordance with an exemplary embodiment, as shown in the lower part of FIG. 3, which displays the details of the hinge 128, in which the basic parts of the sensing device are joined together by hinge 128 equipped with stop 131 which can be designed to accommodate various opening angles 139 in order to avoid damage of interconnecting wires 134 leading through sealing system 129 and which can be sealed and positioned to the center of the basic parts 121, 122 (bottom of sealing canal 136) by sealing pins 135, which are shown in FIGS. 4, 5 and 6.

Wires can be assembled in a device open position and if the device is closed, the wires can bend to the loop 137, which dimensions can be smaller than available space in the non-casted cavity 138 under the hinge. If the sensing device is closed, all parts of sensing circuit can be covered by the two basic parts and two cover parts 121, 122, 123, 124 to relatively ensure the proper function of the sensing device. In accordance with an exemplary embodiment, the closed position can be ensured by clamp on system 130. This gap or opening angle 22 can be realized between the first and the last coil. In accordance with an exemplary embodiment, it can be quite important to be able to use interconnected wires on only one side.

Figure 7:
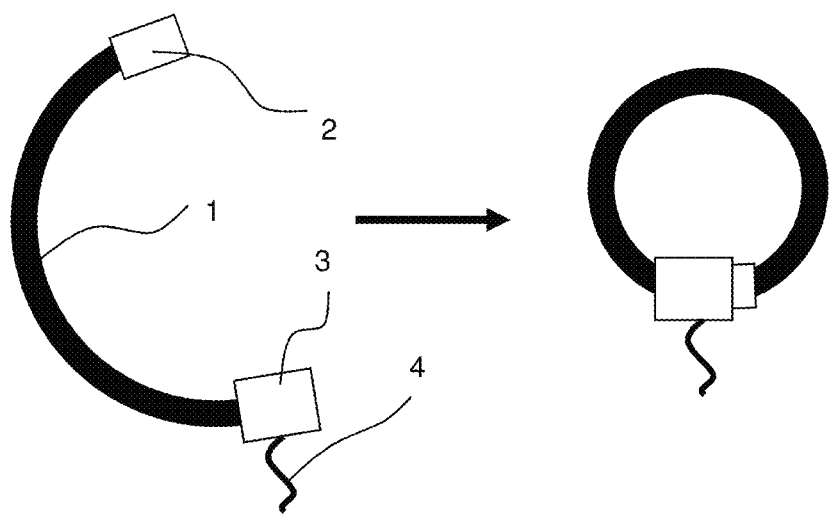
FIG. 7 shows a known sensing device.
Figure 8:
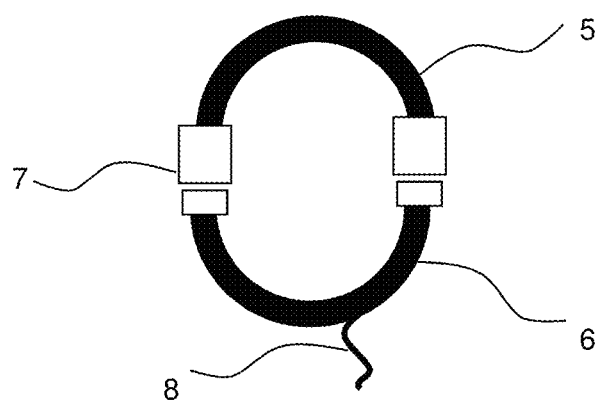
FIG. 8 shows a known sensing device.
Figure 9:
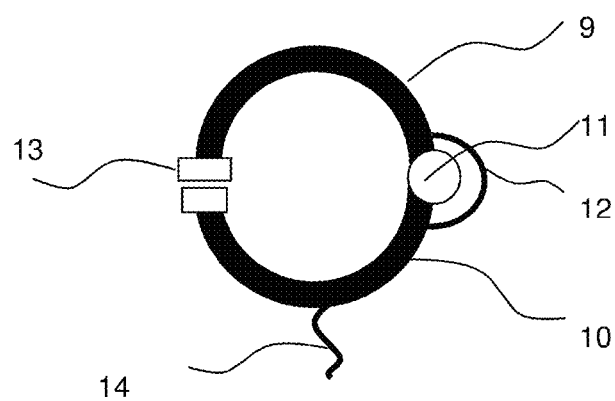
FIG. 9 shows a known sensing device.

Known sensing devices are shown in FIGS. 7 to 9. The known systems for divided sensing devices use three construction systems.

A flexible current sensing device shown in FIG. 7, which can be used with an openable locking mechanism which can consist of flexible coil 1, male locking part 2, female locking part 3 and output cable 4. This concept can allow for relatively easy assembly but can have poor accuracy caused by not being exactly round and having a stable shape.

A measurement device, like shown in FIG. 8 can be made from two solid halves 5, 6 electrically interconnected by some type of connector 7 to achieve closed internal circuit and output cable 8. This concept can provide both good accuracy and ease of assembly but can be significantly higher priced and the design can be more complex.

A measurement device, like shown in FIG. 9 can be made from two solid halves 9, 10 assembled together using hinge 11 and electrically interconnected by some type of cable 12 placed outside of device body to achieve closed internal circuit, locking system 13 and output cable 14. This concept can allow both good accuracy and relatively ease of assembly on a measured line but can have a higher price, a more complex design, and an increased risk of interconnecting cable damage.

For example, openable flexible Rogowski coils (RC) can be continuously wound on a flexible former with discontinuity between the beginning and the end, which can cause problem in achieving good accuracy. In addition, shielding can be done by additional layer and can be covered by insulation.

The present disclosure is different from known Rogowski coils since the disclosure can include several small linear coils, where the gap between the coils is regularly distributed. In accordance with an exemplary embodiment, such construction can achieve high accuracy and is the best construction in cases where the opening of the current sensing device is needed. Opening of the current sensing device can be done between the first and the last coil and thus can have no negative effect on accuracy and position of primary conductor inside the coil. In accordance with an exemplary embodiment, shielding can be done by semi conductive or conductive cover itself, which can serve in the same time as positioning means for the linear coils.

The method of manufacture and the positioning of the functional details for opening the sensor device describes the system of positioning the internal wires and hinge, which should enable relatively easy and reliable opening, but in the same time protecting the wires from being damaged. The current sensing device is also designed such that the filling material will not leak out during the potting process, so it is easily manufacturable.

As such, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE SIGNS

1 flexible coil
2 male locking part
3 female locking part
4 output cable
5 solid halves
6 solid halves
7 connector
8 output cable
9 solid halves
10 solid halves
11 hinge
12 cable
13 locking system
14 output cable
21 small coils
22 equal gap or distance
23 return conductor
25 first linear coil (in the chain arrangement of a series of coils)
26 last linear coil (in the chain arrangement of a series of coils)
30 housing
121 basic part
122 basic part
123 cover part
124 cover part
125 output connector or fixed cable
126 sensing element
127 potting material
128 hinge
129 sealing system
130 clamp on system
131 stop, stopping element
132 pin
134 interconnecting wires
135 sealing pins
136 sealing canal
137 loop
138 non-casted cavity
139 opening angle

What is claimed is:

1. A current sensing device, comprising:
more than two current sensors, implemented in an openable ring-shaped support, and wherein the more than two current sensors are arranged in a chain-like arrangement in the ring-shaped support, and wherein the more than two current sensors are electrically connected in series; and
the ring-shaped support is divided into two half-ring-elements, each of the half-ring-elements being non-flexible and rigid and are mechanically connected by a hinge with a rotary pin, and that an electrical continuous interconnection between a first group of current sensors in a first half-ring element and a second group of current sensors in a second half-ring element is provided by interconnection wires, which are dimensioned in length such that the interconnection wires release a reservoir length of the interconnection wires during the opening of the current sensor device ring via the hinge, wherein the interconnection wires are disposed within the half-ring-elements when the hinge is closed, the interconnection wires thereby being protected by the half-ring-elements.

2. The current sensing device according to claim 1, wherein the more than two current sensors are coils, which are connected in series.

3. The current sensing device according to claim 2, wherein the coils are arranged to have an equal spacing between each of the coils, the coils being linear coils.

4. The current sensing device according to claim 1, comprising:
a ring-shaped housing, which covers the more than two current sensors in the openable ring-shaped support.

5. The current sensing device according to claim 4, wherein the ring-shaped housing is made of a conductive material.

6. The current sensing device according to claim 4, comprising:
a conductive inner surface treatment and/or a conductive outer surface treatment on the ring-shaped housing.

7. The current sensing device according to claim 2, comprising:
a return conductor, which extends from a last coil to a first coil through a center of each of the coils connected in series.

8. The current sensing device according to claim 2, wherein the coils comprises:
a ferromagnetic core or a non-magnetic core.

9. A method of manufacturing the current sensor device according to claim 1, the method comprising:
sealing, via a sealing and wire positioning system, a main cavity in each of the first half-ring element and the second half-ring element of the device during potting by a protective and fixation material which avoids a leakage of the protective and fixation material around interconnecting wires by a combination of thin sockets and sealing pins, which position the interconnecting wires to a non-casted cavity for wire loop protection.

10. The method according to claim 9, comprising: eliminating the sealing pins and shortening the thin sockets.

11. The method according to claim 9, comprising: positioning a rotary axis of the hinge on an outer diameter of the sensing device.

12. The method according to claim 9, wherein the hinge includes a flat part and the rotary pin.

13. The current sensing device according to claim 1, wherein the interconnection wires are disposed radially inward from the rotary pin.

14. The current sensing device according to claim 13, wherein the interconnection wires are looped when the hinge is closed.

15. The current sensing device according to claim 14, wherein the interconnection wires are unlooped when the hinge is open.

* * * * *